(12) United States Patent
Glowacki et al.

(10) Patent No.: US 6,251,834 B1
(45) Date of Patent: Jun. 26, 2001

(54) SUBSTRATE MATERIALS

(75) Inventors: Bartlomiej Andrzej Glowacki; Jan Edgar Evetts, both of Cambridge; Rodney Major, Sussex, all of (GB)

(73) Assignee: Carpenter Technology (UK) Limited (GB)

( * ) Notice: Subject to any disclaimer, the term of this patent is extended or adjusted under 35 U.S.C. 154(b) by 0 days.

(21) Appl. No.: 09/299,059

(22) Filed: Apr. 23, 1999

(30) Foreign Application Priority Data

Apr. 27, 1998 (GB) .................................................. 9808935

(51) Int. Cl.$^7$ .................................................. H01B 12/00
(52) U.S. Cl. ..................... 505/239; 505/230; 505/236; 505/238; 427/62
(58) Field of Search ..................... 505/239, 230, 505/236, 238; 427/62; 439/930

(56) References Cited

U.S. PATENT DOCUMENTS 5,964,966   10/1999   Goyal et al. .

FOREIGN PATENT DOCUMENTS

| 0591588 | 4/1994 | (EP) . |
| 2-291611 | * 12/1990 | (JP) . |
| WO9632201 | 10/1996 | (WO) . |

OTHER PUBLICATIONS

Norton et al, Science vol. 274, pp. 755–757, Nov. 1996.*
Goyal et al, Appl. Phys. Lett. 69(12), pp. 1795–1797, Sep. 1996.*
Kumar et al, Appl. Phys. Lett. 57(24) pp. 2594–2596, Dec. 1990.*
R. Hawsey et al., "Coated Conductors: The Next Generation of High–Tc Wires," Superconductor Industry, Fall 1996, pp. 23–29.
A. Goyal et al., "Conductors with controlled grain boundaries: An approach to the next generation, high temperature superconducting wire," J. Mater. Res., vol. 12, No. 11, Nov. 1997 pp 2924–2940.

* cited by examiner

Primary Examiner—Shrive Beck
Assistant Examiner—Bret Chen
(74) Attorney, Agent, or Firm—Dann, Dorfman, Herrell and Skillman, P.C.

(57) ABSTRACT

The invention provides an improved substrate for growing layers of oxide superconductor materials for use in high current engineering applications. The invention also provides superconducting laminates based on the inventive substrates, and processes for the manufacture thereof. The substrate includes an alloy layer that is formed of either a cube-textured FeNi alloy containing about 47% Ni to 58% Ni, or (b) a cube-texture Ni—Cu alloy in the composition range 41% Ni to 44% Ni. The substrate may further include an oxide buffer layer covering a surface of the alloy layer.

14 Claims, No Drawings

SUBSTRATE MATERIALS

The present invention relates to substrate materials for oxide superconductor layers. The present invention also relates to superconducting laminates comprising a substrate and a layer of an oxide superconductor on the substrate, and to processes for the manufacture of such superconducting laminates.

Oxide superconductors such as $YBa_2Cu_3O_7$ (YBCO) and $Bi_2Sr_2CaCu_2O_8$ (BSCCO) have been found to exhibit superconductivity at temperatures above the boiling point of liquid nitrogen (−196° C.). Unfortunately, it has been found that the bulk oxide superconductors exhibit rather low critical current densities, rendering them unsuitable for a number of potential applications. The low critical current densities are thought to be due in part to poor conduction across the grain boundaries in the ceramic oxide materials, in particular because the materials have highly anisotropic layered structures.

Greatly improved critical current densities have been achieved by depositing the superconducting oxides as highly oriented thin films on oxide substrates, such as oriented single-crystal oxide substrates. Preferably, the texture of the epitaxially grown superconductor layer should be within 1–4 degrees from grain to grain, with the (001) plane of the superconductor lying in the plane of the substrate. The resulting superconducting layers can be fabricated into electronic devices, but the oxide substrates are clearly unsuitable for high-field windings and power transmission applications.

A. Goyal et al. in *J. Mater. Res.* Vol 12, pages 2924–2940 (1997) review recent studies on epitaxially grown thin films of oxide superconductors having controlled grain boundary misorientation distributions (GBMD's).

R. Hawsey and D. Peterson in *Superconductor Industry*, 1996, pages 23–29 describe a process for the deposition of the oxide superconductor YBCO on a substrate of cubic textured nickel with CeO and yttria stabilized zirconia (YSZ) buffer layers. The nickel substrate has a highly cube-textured surface. That is to say, a high proportion of the nickel grains are oriented with their (100) crystallographic axis perpendicular to the substrate surface and with the (010) and (001) axes of the grains parallel. This results in epitaxial growth of the oxide buffer layers and superconductor layers such that the YBCO grains are highly oriented with their (001) crystallographic axis perpendicular to the surface, thereby maximising critical current density in the superconducting layer.

The cubic nickel substrates described above are magnetic at liquid nitrogen temperatures, and are therefore not preferred for some AC superconducting applications. Furthermore, the nickel substrates provide a poor thermal match to YBCO superconductor layers. The quality of thermal expansion matching is relevant to the processability of such superconducting laminates, because the laminates must undergo extensive thermal excursions. Firstly, in production, the superconductor is deposited on the substrate at about 700° C. Secondly, the YBCO layer must be oxidised by treatment in oxygen at 500° C. for an extended period to render it superconducting. Thirdly, the YBCO superconductor must be cooled to liquid nitrogen temperatures (−196° C.) for superconducting operation. It has now been found that improved thermal matching is desirable between the superconductive oxide layer and the substrate in order to minimise damage during the thermal excursions.

Accordingly, it is an object of the present invention to provide a substrate for a superconducting oxide layer that provides better thermal matching to the oxide superconducting layer than pure cubic nickel.

It is a further object of the present invention to provide a non-magnetic alloy substrate for a superconducting oxide layer whereby the resulting superconducting laminate is more suited to some AC engineering applications.

The present invention provides a substrate for an oxide superconductor layer, the substrate comprising an alloy layer consisting essentially of either: (1) a cube texture FeNi alloy in the composition range 47% Ni to 58% Ni; or (b) a cube texture NiCu alloy in the composition range 41% Ni to 44% Ni.

The cubic α-phase alloys of Ni with Fe or Cu provide a good substrate for epitaxial growth of oxide superconductor layers, such as YBCO. The alloy compositions are selected to give improved thermal matching with YBCO over the temperature range −196° C. to +500° C. Furthermore, the NiCu alloys are nonmagnetic, and therefore preferred for use in AC engineering applications.

Preferably, the alloy layers of the substrate according to the invention consist essentially of Fe and Ni, or of Cu and Ni. That is to say, only Ni, Fe and Cu are present in the alloys apart from minor constituents (up to 5%, preferably up to 2%) of impurities or additives such as Mn or Si, for example to regulate grain growth. All percentages are in atomic %.

Preferably, the substrate according to the present invention further comprises an oxide buffer layer covering a surface of the alloy layer. The buffer layer substantially prevents any chemical reactions between the alloy layer and the superconducting oxide layer, and also blocks oxidation of the alloy layer during the oxygen annealing step that must be carried out following deposition of a YBCO layer in order to render it superconductive. More preferably, the oxide buffer layer comprises a refractory oxide such as CeO, MgO or yttria stabilized zirconia (YSZ). Preferably, the buffer layer has a thickness of no more than 5 micrometers.

The surface of the substrate onto which it is intended to deposit the oxide superconductor layer should be smooth, in order to ensure that the oxide is deposited with a high degree of crystallographic orientation and large grains. Preferably, the surface roughness is less than 1 micrometer, more preferably 200 nanometers or less, and most preferably 50 nanometers or less, as determined by profilometric techniques.

The grain size of the alloy substrate should be large for optimal DC applications to minimise percolative effects. For AC applications, the grain size should be small. The grain morphology can be modified by chemical composition adjustment and also by the annealing procedure. The annealing can be carried out in two stages in order to avoid secondary recrystallisation causing development of other non-cubic texture orientations. The first stage annealing is carried out at about 300° C. to establish the cubic texture. This is followed by a high temperature annealing at 700° C. when grain growth takes place. The cube texture and grain size are preferably determined by X-ray diffraction texture goniometry.

In order to achieve highly oriented epitaxial growth of the oxide superconductor layer, the alloy layer of cubic a-phase alloy is cube-textured in orientation with respect to the substrate surface on which deposition of the superconducting layer will take place. That is to say, a substantial fraction of the grains of the alloy should be cube-textured with respect to the substrate surface. The term cube-textured, sometimes called {100}<100> orientation, signifies that the alloy grain is oriented with its (001) crystallographic plane parallel to the alloy layer surface, and with its (100) crystallographic axis parallel to the rolling direction of the alloy layer. Preferably, at least 75% of the grains of the alloy are textured within 6°, more preferably 4°, of ideal cube-texture, more preferably at least 90% of the grains are so oriented.

For high current engineering applications it is preferable for the substrate alloy layer to be as thin as possible in order to maximise the average critical current of the laminate, since the substrate does not itself superconduct under the operating conditions. On the other hand, some structural strength is needed in the alloy layer to enable coils to be wound, and to resist Lorentz forces in operation, especially in high current DC applications. Accordingly, the thickness of the alloy substrate layer is preferably 5–25 micrometers, more preferably 10–15 micrometers. An additional advantage of the FeNi alloys according to the present invention relative to the previously used pure cubic nickel substrate layers is the greater tensile strength of FeNi, which enables a thinner FeNi layer to be used for a given loading relative to pure Ni.

Preferably, the substrate is conveniently formed as an elongate strip having a width of 1–25 mm and in which the thickness of the alloy layer is 5–25 micrometers, preferably 10–15 micrometers. Such strips (tapes) can be manufactured by conventional rolling and annealing steps, preferably followed by additional mechanical polishing and/or electro-polishing to provide an ultrasmooth surface for depositing the superconductor. The length of the strip can be from a few centimeters to hundreds of meters, depending on the applications envisaged.

The linear expansion coefficient of YBCO superconductor before oxidation is $14.7 \times 10^{-6}/°$ C., and after oxidation the superconducting material has a linear expansion coefficient of $11.5 \times 10^{-6}/°$ C. at ambient temperature of about 25° C. Preferably, the alloy layer of the substrate should have a thermal expansion coefficient as near as possible to $11.5 \times 10^{-6}/°$ C. over the temperature range 500° C. to −196° C., since this will provide the best thermal matching with the oxidised superconductor. Potential problems due to thermal mismatch between the substrate and the as-deposited, unoxidised superconductor can substantially be avoided by not cooling the substrate between the deposition and oxidation steps. Instead, the deposition is carried out at the conventional temperature of about 700° C., and the substrate is then cooled to 500° C. for the subsequent-oxidation step. This procedure minimises thermal strains on the superconducting layer.

A pure, textured cubic nickel substrate layer has a linear thermal expansion coefficient of $13 \times 10^{-6}/°$ C., which is higher than ideal. In contrast, the nickel-iron alloy according to the present invention in the range of 47% Ni to 58% Ni has room temperature linear thermal expansion coefficients of between $8 \times 10^{-6}/°$ C. (47% Ni) and $12 \times 10^{-6}/°$ C. (58% Ni). The average linear thermal expansion coefficients from 25°–500° C. provide an even better match with the oxidised superconductor, since the values for nickel-iron are $9 \times 10^{-6}/°$ C. (47% Ni) to $11.5 \times 10^{-6}/°$ C. (58% Ni). Accordingly, the nickel-iron alloy provides both better thermal matching and higher strength than a pure nickel substrate layer.

The nickel-copper substrate layer alloys exhibits slightly less favourable linear thermal expansion coefficients. However, it has been found that copper-nickel alloys in the range 41% to 44% nickel have linear thermal expansion coefficients of $13.5 \times 10^{-6}/°$ C. or less in the temperature range of interest, and are also non-magnetic at liquid nitrogen temperature, thereby rendering them suitable as substrate layers for AC power engineering applications. Alloys containing more than 44% nickel would be magnetic at liquid nitrogen temperature, and would therefore be likely to produce high eddy currents under AC current conditions.

A specific embodiment of the present invention will now be described further, by way of example.

EXAMPLE 1

A nickel-iron alloy consisting of 48.2% Ni, 0.11% Si, 0.43% Mn, balance Fe, was vacuum induction melted and case in the form of a rectangular ingot and then hot rolled to form a 4.5 mm thick tape. The strip was cold rolled to 3 mm thick, annealed and cold rolled to 13 μm thick. The strip was sheared to 10 mm width and coated on one side with an insulated MgO layer 1–2 μm thick. The product was then annealed under a protective oxygen-free atmosphere for a period of 10 minutes. The final tape was 13 μm thick and 10 mm wide. The surface achieved was almost perfectly cubic-texture, enabling the deposition of YBCO suitable for continuous supercurrent current flow through the subsequent grain boundaries (~5 degree misalignment angle) of the epitaxially grown superconductor through the buffer layers (assuming exact epitaxial repetition of the grain boundaries). The misalignment angle was determined by Electron Back Scatter Patterns (EBSP) and also by X-ray diffraction texture goniometry. The grain size of the NiFe 50/50 layer was approximately 30 μm. The surface roughness was up to 600 nm along the rolling direction and 800 nn across the rolling direction. This could be further reduced by electropolishing.

Oxidised superconductors such as YBCO or BSSCO are deposited on the substrate by conventional methods such as sputtering or metal-organic chemical vapour deposition (MOCVD), as described in the references by Hawsey et al. or by Goyal et al. cited above.

Many other embodiments of the present invention falling within the scope of the accompanying claims will be apparent to the skilled reader.

What is claimed is:

1. A substrate for an oxide superconductor layer, said substrate comprising an alloy layer formed from a cube-textured FeNi alloy wherein the FeNi alloy consists essentially of about 47 to 58 atomic % Ni, balance essentially iron said FeNi alloy having an average coefficient of thermal expansion of from about $8 \times 10^{-6}/°$ C. to about $12 \times 10^{-6°}$ C. in the range of 25° C. to 500° C.

2. A substrate according to claim 1, wherein said substrate further comprises an oxide buffer layer covering a surface of the alloy layer.

3. A substrate according to claim 2, wherein the oxide buffer layer comprises a refractory oxide selected from the group consisting of CeO, MgO, and yttria stabilized zirconia (YSZ).

4. A substrate according to claim 1 wherein at least part of the surface of the substrate that supports the oxide superconductor layer has a surface roughness of less than 1 μm.

5. A substrate according to claim 4, wherein said at least part of the surface of the substrate that supports the oxide superconductor layer has a surface roughness of 200 nm or less.

6. A substrate according to claim 5, wherein said at least part of the surface of the substrate that supports the oxide superconductor layer has a surface roughness of 50 nm or less.

7. A substrate according to claim 1, wherein at least 75% of the surface of the alloy layer is cube-textured.

8. A substrate according to claim 1, wherein at least 75% of the grains of said alloy layer are oriented within 6° of ideal cube-textured orientations.

9. A substrate according to claim 1, wherein said alloy layer has a thickness of about 25 μm or less.

10. A substrate according to claim 9 in which the alloy layer is in the form of an elongate strip having a width of about 2–25 mm and a thickness of about 5–25 μm.

11. A superconducting laminate comprising:
a substrate comprising an alloy layer formed from a cube-textured FeNi alloy wherein the FeNi alloy consists essentially of about 47 to 58 atomic % Ni, balance essentially iron said FeNi alloy having an average coefficient of thermal expansion of from about $8\times10^{-6}/°$ C. to about $12\times10^{-6}/°$ C. in the range of 25° C. to 500° C.; and
a layer of an oxide superconductor formed on said substrate.

12. A superconducting laminate according to claim 11, wherein said substrate further comprises an oxide buffer layer covering a surface of the alloy layer.

13. A superconducting laminate according to claim 12, wherein the oxide buffer layer comprises a refractory oxide selected from the group consisting of CeO, MgO, and yttria stabilized zirconia (YSZ).

14. A superconducting laminate according to claim 11, wherein the oxide superconductor consists essentially of YBCO ($YBa_2Cu_3O_7$) having grains oriented substantially (100) relative to the surface of the substrate.

* * * * *